United States Patent [19]

Rosier et al.

[11] 4,277,764
[45] Jul. 7, 1981

[54] MICROWAVE TRANSISTOR STABILIZATION CIRCUIT

[75] Inventors: Charles D. Rosier, Palm Bay; Jing-Jong Pan; Donald K. Belcher, both of Melbourne, all of Fla.

[73] Assignee: Harris Corporation, Cleveland, Ohio

[21] Appl. No.: 932,305

[22] Filed: Aug. 9, 1978

[51] Int. Cl.³ .................. H03H 11/04; H03F 3/16; H03F 3/191
[52] U.S. Cl. .................. 333/24 C; 307/304; 330/277; 330/302
[58] Field of Search .................. 330/277, 302, 305; 307/304; 333/20, 27, 24 C; 328/65; 334/41, 45

[56] References Cited

U.S. PATENT DOCUMENTS

| | | | |
|---|---|---|---|
| 3,419,813 | 12/1968 | Kamnitsis | 330/305 X |
| 3,973,214 | 8/1976 | Rheinfelder | 330/305 |
| 4,011,518 | 3/1977 | Irvine et al. | 330/277 X |
| 4,025,873 | 5/1977 | Chilluffo | 330/277 |
| 4,041,412 | 8/1977 | Malone | 330/305 X |
| 4,053,842 | 10/1977 | Turski et al. | 330/277 X |
| 4,075,576 | 2/1978 | Eden | 330/277 |
| 4,114,051 | 9/1978 | Curtice | 328/65 X |
| 4,152,666 | 5/1979 | Kajikawa et al. | 330/302 X |
| 4,162,412 | 7/1979 | Mawhinney et al. | 307/237 |

OTHER PUBLICATIONS

Hoult et al., "V.H.F. F.E.T. Preamplifier with 0.3dB Noise Figure;" Electronics Letters (pub.); vol. 11, No. 24, pp. 596–597; 11/27/75.

Pierro, *IEEE Trans. on Microwave Theory and Techniques,* pp. 972–975; 12/76.

Allen et al., "1.8 GHz Lumped Component Thick Film Amplifier;" Electrocomponent Science and Technology; 1974, vol. 1, pp. 141–144.

Liechti "Microwave Field—Effect Transistors—1976;" IEEE Trans. on Microwave Theory and Techniques; vol. MTT-24, No. 6, pp. 279–300; 6/76.

*Primary Examiner*—Larry N. Anagnos
*Attorney, Agent, or Firm*—Craig & Antonelli

[57] ABSTRACT

A microwave transistor circuit includes a pair of field effect transistors connected in cascade via a standard 50 ohm transmission line having a length equal to one-half the wavelength of the operating frequency range of the circuit. Although the field effect transistors are individually unstable at microwave frequencies, by cascading these transistors the reverse transmission coefficient is sufficiently reduced to render the overall circuit unconditionally stable. In addition, the transmission line is opened to provide physical isolation between the transistors for d.c. bias isolation and a capacitor is connected therein to provide for RF continuity.

7 Claims, 3 Drawing Figures

MICROWAVE TRANSISTOR STABILIZATION CIRCUIT

BACKGROUND OF THE INVENTION (1) Field of the Invention

The present invention relates in general to microwave circuits, and more particularly, to field-effect transistor circuits operating in the microwave frequency range.

(2) Description of the Prior Art

Field effect transistor circuits are generally conditionally stable at microwave frequencies. One method for stabilizing such circuits at UHF and below is to resistive load the device; however, this technique has not been effective at microwave frequencies.

In general a two port device, as schematically illustrated in FIG. 1, as may be defined in accordance with its S-parameters, as follows:

$$[S] = \begin{bmatrix} S_{11} & S_{12} \\ S_{21} & S_{22} \end{bmatrix}$$

Such a two port device, for example, a transistor device, is potentially unstable at microwave frequencies, because the reverse transmission coefficient $S_{12}$ is too large. Thus, if some means could be devised for reducing the reverse transmission coefficient sufficiently, the network can be made unconditionally stable.

Typical problems encountered in trying to reduce the reverse transmission coefficient of a two port device operating at microwave frequencies, such as the affect of additional conductive lead lines and the need to provide d.c. bias isolation between stages, has made stabilization of such devices difficult to accomplish in practice. Thus, the use of field effect transistors for microwave applications has been seriously restricted.

SUMMARY OF THE INVENTION

The principal object of the present invention is to unconditionally stabilize a potentially unstable microwave transistor circuit.

Another object of the present invention is to unconditionally stabilize a microwave circuit with simultaneous conjugate input and output matching by relatively simple and inexpensive means.

A further object of the present invention is to provide a circuit of the type described in which the reverse isolation thereof is additionally greatly improved.

In accordance with the present invention a potentially unstable microwave transistor circuit is unconditionally stabilized by connecting two transistors in cascade to reduce the overall reverse transmission coefficient to the point where the composite circuit is unconditionally stable. This technique allows simultaneous conjugate input and output matching, while additionally providing great improvement in the reverse isolation of the circuit.

In order to permit connection of the two transistors in cascade for operation at microwave frequencies without introducing errors or affecting the required d.c. bias isolation of the two transistors, the drain of the first transistor is connected to the gate of the second transistor by way of a 50 ohm transmission line have a length of $\gamma/2$ at the operating frequency of the circuit. A small gap for d.c. blocking is provided in the transmission line so that the devices will be separated and a coupling capacitor is connected in the gap to provide RF continuity.

These and other objects, features and advantages of the present invention will be described in greater detail hereinafter with reference to the accompanying drawings in which there is illustrated an exemplary embodiment of the invention.

DETAILED DESCRIPTION OF THE EXEMPLARY EMBODIMENT

Figure 1:
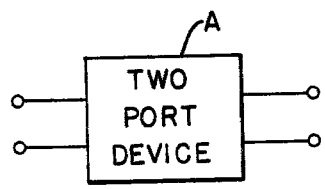
FIG. 1 is a diagrammatic illustration of a two port device.
Figure 2:
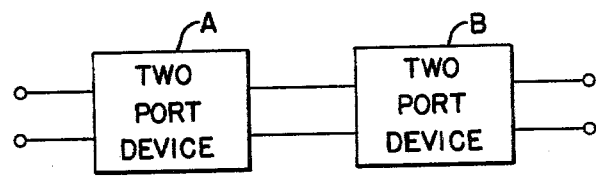
FIG. 2 is a diagrammatic illustration of a pair of two port devices connected in cascade in accordance with the basic principle of the present invention.

The present invention takes advantage of the fact that the reverse transmission coefficient for transistor devices is less than unity. Thus, if a pair of two port devices are connected in cascade, as seen in FIG. 2, the S-parameters of the composite circuit may be expressed as follows:

$$S_{11} = S_{11}^A + S_{12}^A S_{11}^B (1 - S_{22}^A S_{11}^B)^{-1} S_{21}^A$$

$$S_{12} = S_{12}^A S_{12}^B (1 - S_{11}^B S_{22}^A)^{-1}$$

$$S_{21} = S_{21}^B S_{21}^A (1 - S_{11}^B S_{22}^A)^{-1}$$

$$S_{22} = S_{22}^B + S_{21}^B S_{22}^A (1 - S_{11}^B S_{22}^A)^{-1} S_{12}^B$$

From the above equation for $S_{12}$, it is seen that the overall reverse transmission term $S_{12}$ of the cascaded two ports is proportional to the product of the reverse transmission terms $S_{12}^A$ and $S_{12}^B$ of the individual two ports.

As is well known, the product of two numbers less than one results in a number which is smaller than either number multiplied. Since the reverse transmission term for transistors is less than one, multiplying the two reverse terms results in a smaller overall reverse term. The $(1-S_{11}^B S_{22}^A)^{-1}$ term in the term $S_{12}$ will normally be no larger than and typically smaller than a factor of three. Thus, the $(1-S_{11}^B S_{22}^A)^{-1}$ term will not significantly affect the magnitude of the overall reverse transmission term $S_{12}$. Therefore, the overall cascaded circuit, as depicted diagrammatically in FIG. 2, using potentially unstable devices can be unconditionally stable, since the stability factor thereof is much greater than one.

Connecting two devices directly in cascade at microwave frequencies is practically unrealizable. This is because of the necessity of maintaining d.c. bias isolation for the two devices. Also, due to the short wavelength at which the system operates, any length of lead wires between the devices will introduce errors in the operation of the device. However, this problem is solved in accordance with the present invention by connecting the cascaded devices using a standard 50 ohm transmission line having a length of $\gamma/2$ at the operating frequency of the circuit.

Figure 3:
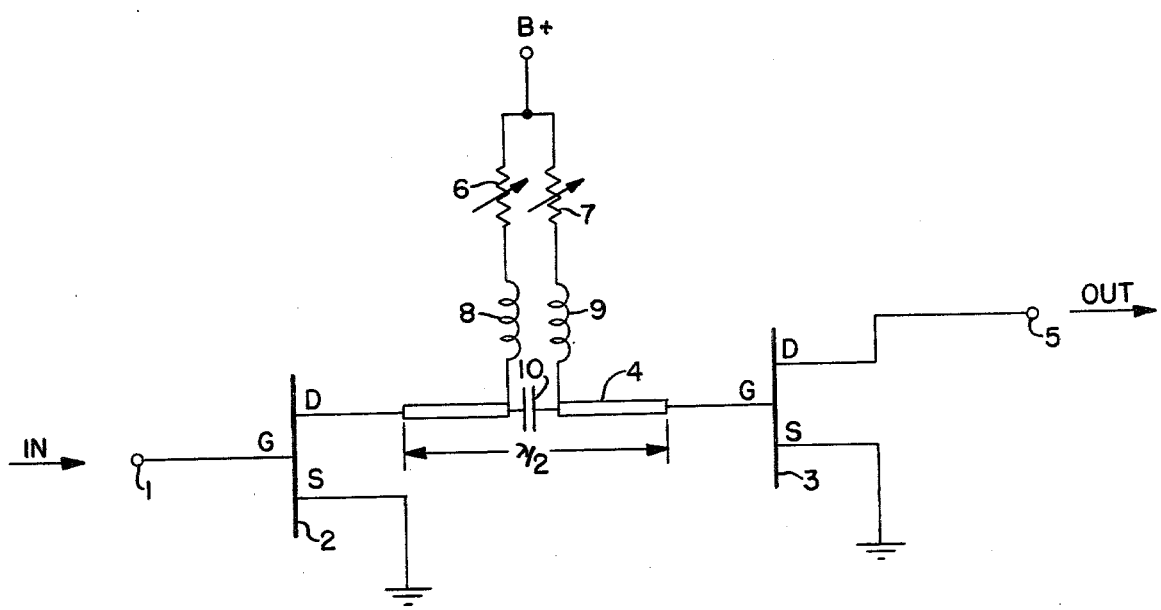
FIG. 3 is a schematic circuit diagram of a field effect transistor circuit forming an exemplary embodiment of the present invention.

FIG. 3 is a schematic circuit diagram of a transistor buffer circuit, embodying the features of the present invention, which is designed for use in a frequency range in the vicinity of 5 GHz. With such a circuit it is desirable to obtain a good input and output voltage standing wave ratio (VSWR) of 1.5:1 or better over the operating frequency band. Also, it should have good reverse isolation for good load isolation.

To obtain a good input and output VSWR it is necessary to simultaneously conjugate match the input and the output of the circuit to 50 ohms, and to accomplish this, the circuit must be unconditionally stable over the frequency band of interest, i.e. $K > 1$, where K is the stability factor of the transistor device. However, transistor devices, such as Gallium Arsenide field effect transistors, are potentially unstable for this frequency band because the stability factor K thereof, as calculated using the device S-parameters, is less than one.

Referring more specifically to FIG. 3, the input terminal 1 of the circuit is connected to the gate electrode of a first field effect transistor 2, the source electrode of which is connected to ground. The drain electrode of the transistor 2 is connected to the gate electrode of a second field effect transistor 3 via a standard 50 ohm transmission line 4, the length of which is equal to one-half the wavelength at the operating frequency of the circuit. The source electrode of the transistor 3 is connected to ground and the drain electrode thereof is connected to output terminal 5 of the circuit. Direct current is supplied to the circuit from a power supply B+ via respective variable resistors 6 and 7 as well as coils 8 and 9 to the transmission line 4.

A break is placed in the transmission line 4 and a coupling capacitor 10 is inserted therein to maintain the RF continuity, while the d.c. bias of the transistors 2 and 3 is isolated by the break in the transmission line 4. This transmission line will only introduce a phase change of 180° in the reverse and forward transmission terms of the composite circuit and will not affect the magnitudes of the forward and reverse coefficients if the line is lossless.

Thus, by cascading two field effect transistors using a standard 50 ohm transmission line which is split to provide physical isolation between the transistors, a physically realizable circuit can be constructed using potentially unstable devices yielding an inherently stable overall circuit. In addition, such a circuit arrangement was found to provide greatly improved reverse isolation with conjugate input and output matching by relatively simple and inexpensive means.

While the invention has been particularly shown and described with reference to an exemplary embodiment thereof, it will be understood by those skilled in the art that various changes in form and details may be made therein without departing from the spirit and scope of the invention.

What is claimed is:

1. A microwave transistor circuit comprising a transmission line having a length equal to one-half of the wavelength of the center frequency of a selected microwave frequency band, and first and second transistors connected in cascade by said transmission line, said transmission line having a gap therein and further including a capacitor connected to said transmission line in said gap.

2. A microwave transistor circuit as defined by claim 1, wherein said gap is in the center of said transmission line.

3. A microwave transistor circuit as defined by claim 1 wherein said first and second transistors individually have a stability factor less then unity, but when connected in cascade exhibit a combined stability factor greater than unity.

4. A microwave transistor circuit as defined by claim 3, wherein said first and second transistors are field effect transistors.

5. A microwave transistor circuit as defined by claim 3 wherein said transmission line is a standard 50 ohm line.

6. A microwave transistor circuit as defined by claim 1, further including means for supplying a d.c. bias voltage to both sides of said capacitor.

7. A method of stabilizing a microwave transistor circuit including a transistor which is inherently unstable at microwave frequencies, comprising the steps of
reducing the reverse transmission coefficient of said transistor circuit by connecting said transistor in cascade with a second similar transistor, and
providing d.c. bias isolation for said transistors while retaining RF continuity and conjugate input and output impedance matching by connecting said transistors together with a split transmission line to which there is connected a capacitor to provide RF continuity.

* * * * *